(12) United States Patent
Ryu et al.

(10) Patent No.: US 7,078,256 B2
(45) Date of Patent: Jul. 18, 2006

(54) NITRIDE SEMICONDUCTOR LED IMPROVED IN LIGHTING EFFICIENCY AND FABRICATION METHOD THEREOF

(75) Inventors: Yung Ho Ryu, Seoul (KR); Kee Jeong Yang, Seoul (KR); Bang Won Oh, Kyungki-do (KR); Jin Sub Park, Kyungki-do (KR); Young Hoon Kim, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 110 days.

(21) Appl. No.: 10/875,321

(22) Filed: Jun. 25, 2004

(65) Prior Publication Data
US 2005/0208686 A1 Sep. 22, 2005

(30) Foreign Application Priority Data
Mar. 18, 2004 (KR) .................. 10-2004-0018597

(51) Int. Cl.
*H01L 21/00* (2006.01)
(52) U.S. Cl. ............................... 438/39; 438/45
(58) Field of Classification Search .............. 438/39, 438/45
See application file for complete search history.

(56) References Cited

U.S. PATENT DOCUMENTS

| | | | |
|---|---|---|---|
| 5,563,422 A | 10/1996 | Nakamura et al. | |
| 6,242,761 B1 * | 6/2001 | Fujimoto et al. | 257/94 |
| 6,526,082 B1 | 2/2003 | Corzine et al. | |
| 6,593,597 B1 * | 7/2003 | Sheu | 257/94 |
| 6,686,610 B1 * | 2/2004 | Sheu | 257/103 |
| 2002/0179918 A1 | 12/2002 | Sung et al. | |

* cited by examiner

*Primary Examiner*—Chandra Chaudhari
(74) *Attorney, Agent, or Firm*—Lowe Hauptman & Berner, LLP.

(57) ABSTRACT

A nitride semiconductor LED improved in lighting efficiency and a fabrication method thereof, in which an n-doped semiconductor layer is formed on a substrate. An active layer is formed on the n-doped semiconductor layer to expose at least a partial area of the n-doped semiconductor layer. A p-doped semiconductor layer is formed on the active layer. A p+-doped semiconductor layer is formed on the p-doped semiconductor layer. An n+-doped semiconductor layer is formed in at least a partial upper region of the p+-doped semiconductor layer via n-dopant ion implantation. The n+-doped semiconductor layer cooperates with an underlying partial region of the p+-doped semiconductor layer to realize a reverse bias tunneling junction. Also, an upper n-doped semiconductor layer is formed on the n+-doped semiconductor layer to realize lateral current spreading. The invention can improve lighting efficiency by using the reverse bias tunneling junction and/or the lateral current spreading.

12 Claims, 7 Drawing Sheets

NITRIDE SEMICONDUCTOR LED IMPROVED IN LIGHTING EFFICIENCY AND FABRICATION METHOD THEREOF

CLAIM OF PRIORITY

This application claims the benefit of Korean Patent Application No. 2004-18597 filed on Mar. 18, 2004, in the Korean Intellectual Property Office, the disclosure of which is incorporated herein by reference.

BACKGROUND OF THE INVENTION

1. Field of the Invention

The present invention relates to a nitride semiconductor Light Emitting Diode (LED) improved in lighting efficiency and a fabrication method thereof. In particular, the present invention relates to a nitride semiconductor LED, which is improved in lighting efficiency by using a reverse bias tunneling junction and/or lateral current spreading, and a fabrication method thereof.

2. Description of the Related Art

In general, nitride semiconductors are used in LEDs for generating blue or green wavelength light. Such nitride semiconductors may be expressed by an equation of $Al_xIn_yGa_{(1-x-y)}N$, wherein $0 \leq x \leq 1$, $0 \leq y \leq 1$ and $0 \leq x+y \leq 1$.

LEDs for generating green light are produced by using GaN semiconductors having a wide band gap of about 3.4 eV. A nitride semiconductor of for example GaN has a wide band gap, which acts as a problem in the formation of electrodes and ohmic contact structures. In more detail, there are problems in that contact resistance increased in a p-electrode region also raises the drive voltage while enhancing the heat generation of a diode. Although various schemes may be proposed as means for forming the ohmic contact structures, actually adoptable means are extremely restrictive because those regions forming ohmic contact structures also function as major light emitting surfaces, thereby bringing a critical requirement of allowing light from the active layer to pass through the major light transmitting surfaces.

As a conventional technique satisfying such requirements, there is proposed U.S. Pat. No. 5,563,422, which is entitled "Gallium Nitride-Based III–V Group Compound Semiconductor Device and Method of Producing the Same" and assigned to Nichia Chemical Industries, Ltd. This document proposes a transparent electrode layer using a Ni/Au double layer, and a structure of a nitride semiconductor LED disclosed in this document is shown in FIG. 1.

As shown in FIG. 1, a conventional nitride semiconductor LED 10 includes an n-doped GaN cladding layer 13, a GaN/InGaN active layer 15 of a Multiple Quantum Well (MQW) structure and a p-doped GaN cladding layer 17 formed in their order on a sapphire (Al2O3) substrate 11, in which the p-doped GaN cladding layer 17 and the GaN/InGaN active layer 15 are removed in part to partially expose the top surface of the n-dope GaN cladding layer 13. The nitride semiconductor LED 10 also includes an n-electrode 19a formed on the n-doped GaN cladding layer 13 and an ohmic contact structure. The ohmic contact structure is constituted of a transparent electrode 18 of Ni/Au formed on the p-doped GaN cladding layer 17 and a p-bonding electrode 19b formed on the transparent electrode 18. The transparent electrode 18 is provided to improve contact resistance while ensuring transparency, and may be obtained via deposition of a Ni/Au double layer and subsequent heat treatment.

However, according to the afore-described technique, the transparent electrode attached on the p-doped semiconductor layer causes relatively poor ohmic contact properties thereby increasing drive voltage. It is also difficult to improve brightness since only relatively low transparency metals such as Ni/Au are attached on the p-doped semiconductor layer owing to weak bonding force of the p-doped semiconductor layer with respect to metal. Furthermore, the n-doped GaN cladding layer shows relatively bad overvoltage resistance when bonded with the n-electrode.

SUMMARY OF THE INVENTION

The present invention has been made to solve the foregoing problems of the prior art and it is therefore an object of the present invention to provide a nitride semiconductor LED which is improved in lighting efficiency by using a reverse bias tunneling junction and a fabrication method thereof.

It is another object of the present invention to provide a nitride semiconductor LED which is improved in lighting efficiency by using lateral current spreading and a fabrication method thereof.

According to an aspect of the invention for realizing the object, there is provided a fabrication method of nitride semiconductor Light Emitting Diodes (LEDs), the method comprising the following steps of:

(a) forming an n-doped semiconductor layer on a substrate;

(b) forming an active layer on the n-doped semiconductor layer;

(c) forming a p-doped semiconductor layer on the active layer;

(d) forming a p+-doped semiconductor layer on the p-doped semiconductor layer;

(e) implanting n-dopant ions into the p+-doped semiconductor layer to convert at least a portion of the p+-doped semiconductor layer into an n+ doped semiconductor layer so that the n+-doped semiconductor layer cooperates with a remaining region of the p+-doped semiconductor layer to form a reverse bias tunneling junction; and (f) mesa-etching a resultant semiconductor structure to the extent of exposing a partial area of the n-doped semiconductor layer.

Preferably, the ion implantation step (e) may comprise: forming a SiO$_2$ layer on the resultant semiconductor layer; etching the SiO$_2$ layer to expose at least a portion of the p+-doped semiconductor layer; implanting n-dopant ions through the etched portion of the SiO$_2$ layer; and removing the SiO$_2$ layer via heat treatment.

Preferably, the ion implantation step (e) implants n-dopants in high and low energy levels into an upper region of the p+-doped semiconductor layer to form an n+-doped semiconductor layer on the remaining region of the p+-doped semiconductor layer and an upper n-doped semiconductor layer on the n+-doped semiconductor layer, thereby realizing lateral current spreading.

Preferably, the ion implantation step (e) may comprise: implanting n-dopant ions at a first energy level into an upper region of the n+-doped semiconductor layer to form an n+-doped semiconductor layer on the remaining region of the p+-doped semiconductor layer; and implanting n-dopant at a second energy level different from the first energy level into the upper region of the n+-doped semiconductor layer to form an upper n-doped semiconductor layer on the n+-doped semiconductor layer, thereby realizing lateral current spreading.

Also, the fabrication method of nitride semiconductor LEDs of the invention may further comprise the step of: (g) forming p- and n-electrodes on the upper n-doped semiconductor layer and the exposed partial area of the n-doped semiconductor layer, respectively, after the ion implantation step (e).

In addition, the fabrication method of nitride semiconductor LEDs may further comprise the step of: (h) forming a p-transparent electrode and an n-electrode on the n+-doped semiconductor layer and the exposed partial area of the n-doped semiconductor layer, respectively, after the etching step (f), wherein the transparent electrodes are made of at least one selected from a group consisting of Indium-Tin Oxide (ITO), Cadmium-Tin Oxide (CTO) and Titanium Tungsten Nitride (TiWN).

According to another aspect of the invention for realizing the object, there is provided a fabrication method of nitride semiconductor Light Emitting Diodes (LEDs), the method comprising the following steps of:

(a) forming an n-doped semiconductor layer on a substrate;

(b) forming an active layer on the n-doped semiconductor layer;

(c) forming a p-doped semiconductor layer on the active layer;

(d) forming p+-doped semiconductor layer on the p-doped semiconductor layer;

(e) forming an upper n-doped semiconductor layer on the p+-doped semiconductor layer;

(f) implanting n-dopant ions into the upper n-doped semiconductor layer to convert at least a partial region of the upper n-doped semiconductor layer into an n+-doped semiconductor layer so that the n+-doped semiconductor layer cooperates with a remaining region of the p+-doped semiconductor layer to form a reverse bias tunneling junction; and (g) mesa-etching a resultant semiconductor structure to the extent of exposing a partial area of the n-doped semiconductor layer.

Preferably, the ion implantation step (f) may comprise: forming a SiO$_2$ layer on the resultant semiconductor layer; etching the SiO$_2$ layer to expose at least a portion of the p+-doped semiconductor layer; implanting n-dopant ions through the etched portion of the SiO$_2$ layer; and removing the SiO$_2$ layer via heat treatment.

Preferably, the ion implantation step (f) may comprise: implanting n+-dopants at a predetermined energy level into a lower region of the n-doped semiconductor layer to form an n+-doped semiconductor layer, whereby the n+-doped semiconductor layer cooperates with an upper remaining region of the n-doped semiconductor layer to realize lateral current spreading.

Also, the fabrication method of nitride semiconductor LEDs of the invention may further comprise the step of: (h) forming p- and n-electrodes on the upper n-doped semiconductor layer and the exposed partial area of the n-doped semiconductor layer, respectively, after the ion implantation step (f).

In addition, the fabrication method of nitride semiconductor LEDs of the invention may further comprise the step of: (i) forming a p-transparent electrode and an n-electrode on the n+-doped semiconductor layer and the exposed partial area of the n-doped semiconductor layer, respectively, after the etching step (g), wherein the transparent electrodes are made of at least one selected from a group consisting of Indium-Tin Oxide (ITO), Cadmium-Tin Oxide (CTO) and Titanium Tungsten Nitride (TiWN).

According to yet another aspect of the invention for realizing the object, there is provided a nitride semiconductor Light Emitting Diode (LED) comprising: an n-doped semiconductor layer formed on a substrate; an active layer formed on the n-doped semiconductor layer to expose at least a partial area of the n-doped semiconductor layer; a p-doped semiconductor layer formed on the active layer; a p+-doped semiconductor layer formed on the p-doped semiconductor layer; and an n+-doped semiconductor layer formed in at least a partial upper region of the p+-doped semiconductor layer via n-dopant ion implantation, the n+-doped semiconductor layer cooperating with an underlying partial region of the p+-doped semiconductor layer to realize a reverse bias tunneling junction.

Also, the nitride semiconductor LED of the invention may further comprise an upper n-doped semiconductor layer formed on the p+-doped semiconductor layer in order to realize lateral current spreading.

Preferably, the n+-doped semiconductor layer may be formed at an energy level different from that of the upper n-doped semiconductor layer.

Also, the nitride semiconductor LED of the invention may further comprise a p-electrode formed on the upper n-doped semiconductor layer and an n-electrode formed on the exposed partial area of the n-doped semiconductor layer.

In addition, the nitride semiconductor LED of the invention may further comprise a p-transparent electrode formed on the n+-doped semiconductor layer and an n-electrode formed on the exposed partial area of the n-doped semiconductor layer, wherein the transparent electrodes are made of at least one selected from a group consisting of Indium-Tin Oxide (ITO), Cadmium-Tin Oxide (CTO) and Titanium Tungsten Nitride (TiWN).

DETAILED DESCRIPTION OF THE PREFERRED EMBODIMENT

The above and other objects, features and other advantages of the present invention will be more clearly understood from the following detailed description taken in conjunction with the accompanying drawings, in which:

First Embodiment

Figure 1:
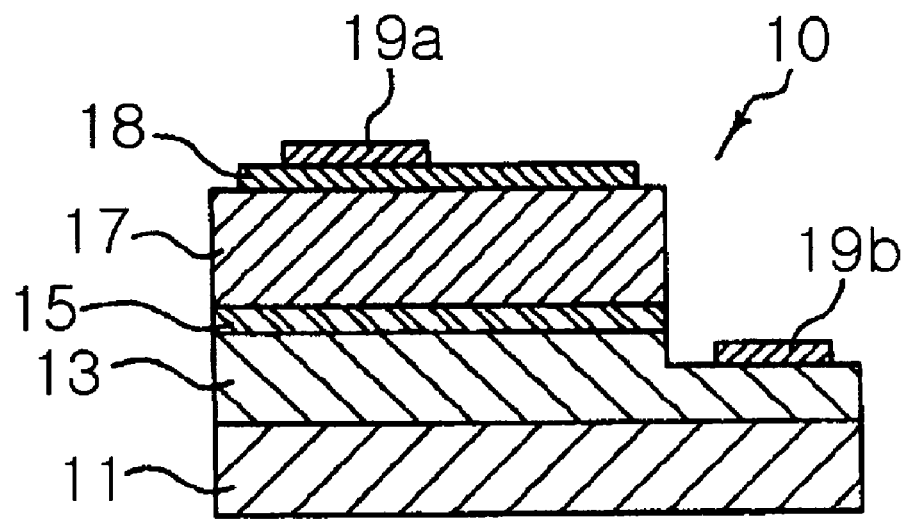
FIG. 1 is a sectional view illustrating a conventional nitride semiconductor LED structure.
Figure 2:
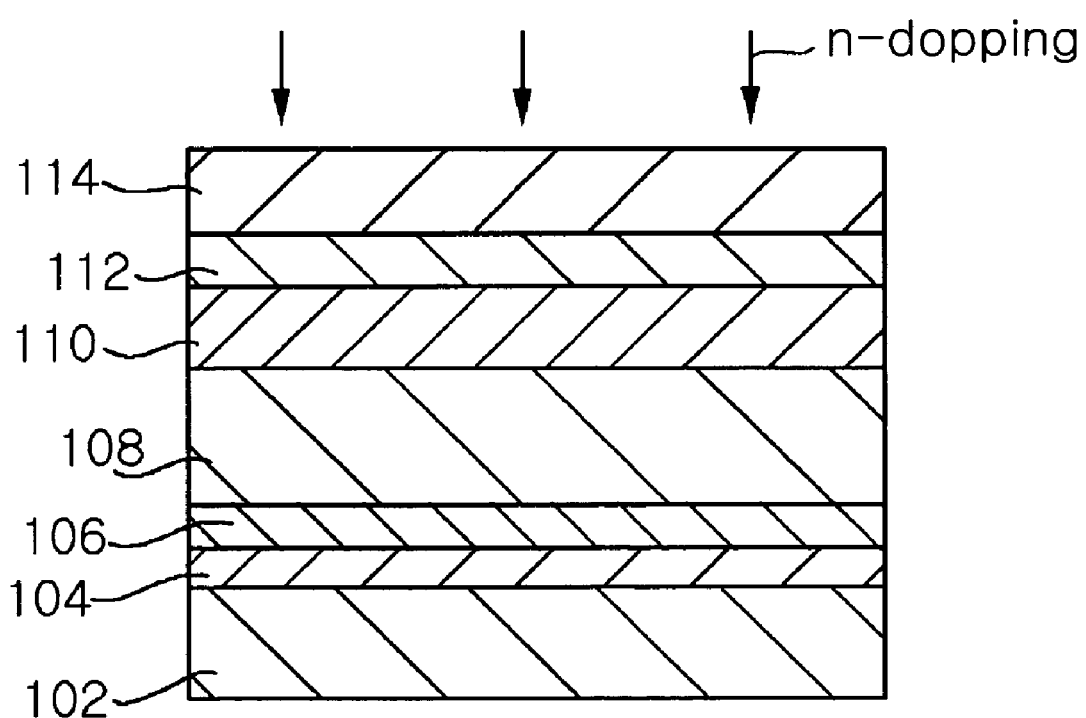
FIGS. 2 to 4 are stepwise sectional views illustrating a fabrication method of a nitride semiconductor LED according to a first embodiment of the invention.
Figure 3:
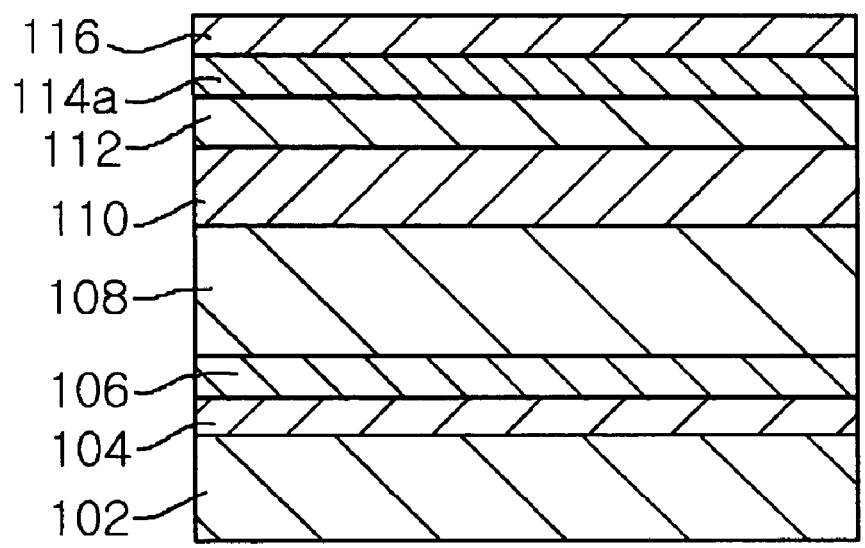
Figure 4:
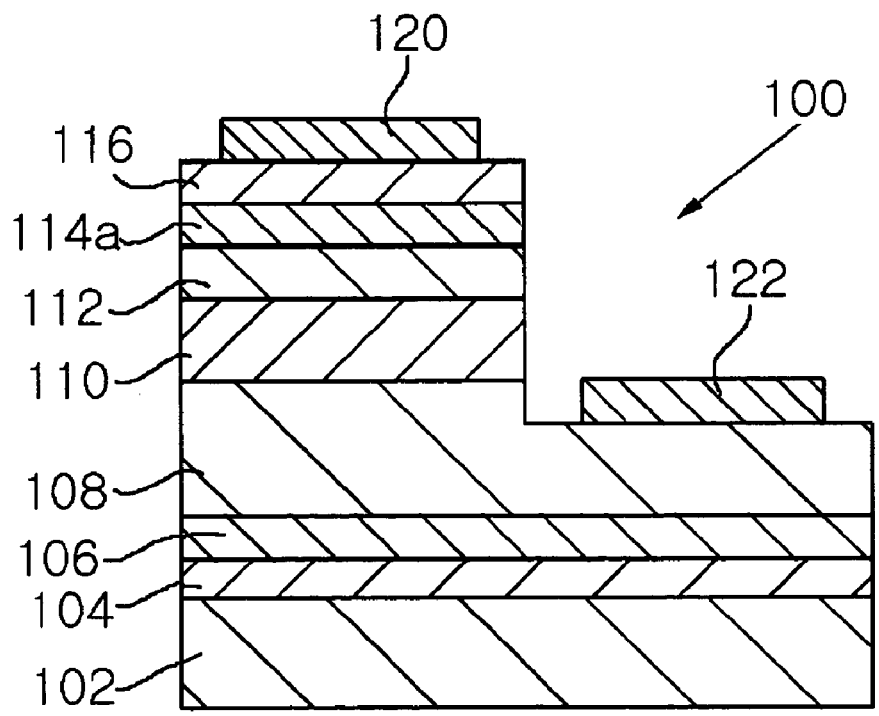

FIGS. 2 to 4 are stepwise sectional views illustrating a fabrication method of a nitride semiconductor LED according to a first embodiment of the invention.

First, as shown in FIG. 2, a buffer layer 104, an undoped GaN layer 106, an n-doped semiconductor layer 108, an active layer 110, a p-doped semiconductor layer 112 and a high concentration p-doped or p+-doped semiconductor layer 114 are grown in their order on a sapphire substrate 102 to form a semiconductor structure, and an ion implantation process is performed to implant high concentration n-dopants or n+-dopants into the p+-doped semiconductor layer 114.

The ion implantation process may be carried out by forming a SiO$_2$ buffer layer on the p+-doped semiconductor layer 114 and selectively etching the buffer layer to implant n+-dopants into a desired region. In this case, the ion implantation process forms the SiO$_2$ buffer layer on the p+-doped semiconductor layer 114, i.e., the top of the semiconductor structure, etches the SiO$_2$ buffer layer to expose a portion of the p+-doped semiconductor layer, implants n-dopant ions through the etched portion of the SiO$_2$ buffer layer, and performs proper heat treatment such as Rapid Thermal Annealing (RTA) to activate the n-dopants and remove the SiO$_2$ buffer layer.

Preferably, the n-dopants are ion-implanted at a concentration of about 1E15 to 1E16 atoms/cm$^2$ under an acceleration voltage of about 100 eV to 50 keV. The n-dopants may be at least one selected from the group consisting of C, Si, Ge, Sn, Ni, P, As, Sb and so on. Subsequent heat treatment is preferably carried out in a temperature range from about 700 to 1300° C. under a nitrogen atmosphere for about 1 to 30 minutes.

Alternatively, high concentration n-dopants may be implanted into the p+-doped semiconductor layer 114 without the formation of the SiO$_2$ buffer layer.

In response to the ion implantation process as above, a high concentration n-doped or n+-doped semiconductor layer 116 is formed in an upper region of the p+-doped semiconductor layer 114, but a lower region underlying the n+-doped semiconductor layer 116 remains as a p+-doped semiconductor layer 114a as shown in FIG. 3. The above ion implantation process can precisely control the dose of dopant ions resultantly imparting desired characteristics to the n+-doped semiconductor layer 116. As the n+-doped semiconductor layer 116 is formed on the p+-doped semiconductor layer 114a, a reverse bias tunneling junction is established between the semiconductor layers 116 and 114a.

Then, a resultant semiconductor structure obtained as above is mesa-etched to the extent of exposing a partial area of the n-doped semiconductor layer 108, and a p-transparent electrode 120 and an n-electrode 122 are formed on the n+-doped semiconductor layer 116 and the exposed partial area of the n-doped semiconductor layer 108, respectively, to produce a nitride semiconductor 100 of the invention.

Also, because the reverse bias tunneling junction is formed between the n+-doped semiconductor layer 116 and the p+-doped semiconductor layer 114a, an excellent ohmic contact is ensured between the uppermost n+-doped semiconductor layer 116 and the transparent metal electrode 120. Then, in place of a conventional Ni/Au metal layer, the p-transparent electrode 120 can be made of at least one selected from the group consisting of Indium-Tin Oxide (ITO), Cadmium-Tin Oxide (CTO) and Titanium Tungsten Nitride (TiWN) of excellent transparency. The transparent electrode of the invention can improve the brightness of the nitride semiconductor LED 100 since they have light transparency superior to that of the conventional transparent electrode of Ni/Au, in which for example ITO has a light transparency of about 90 to 98% but Ni/Au has a light transparency of about 65 to 80%.

This semiconductor structure as above can lower the drive voltage of the entire nitride semiconductor 100 based upon the excellent ohmic contact while improving the brightness owing to the transparent electrode of excellent transparency.

Second Embodiment

Figure 5:
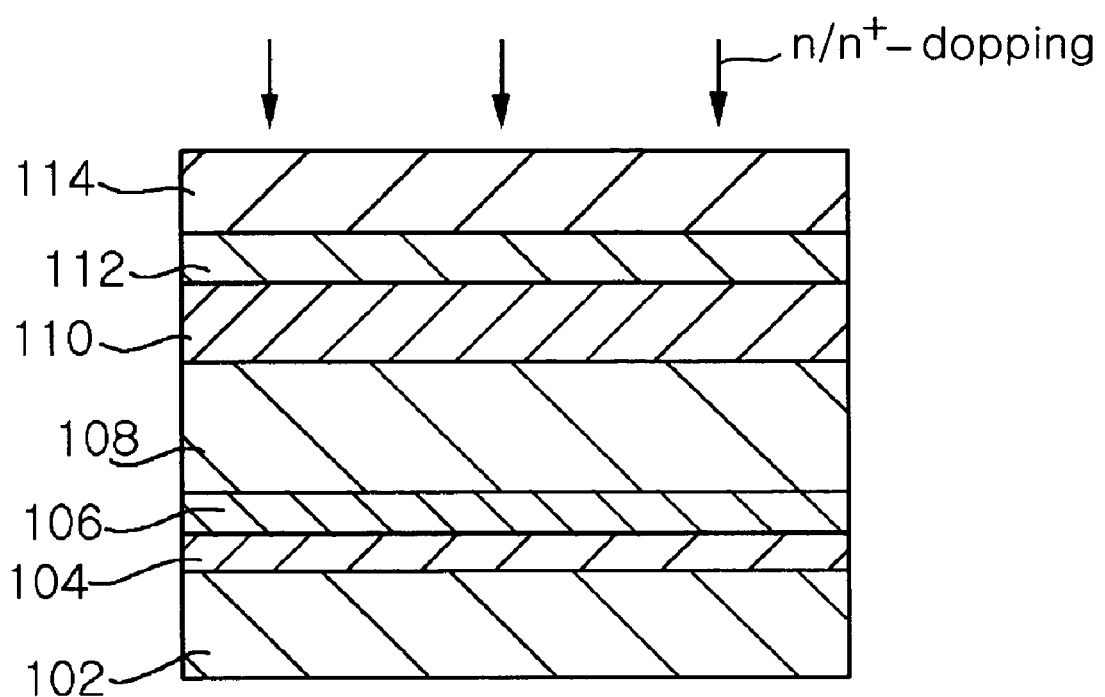
FIGS. 5 to 7 are stepwise sectional views illustrating a fabrication method of a nitride semiconductor LED according to a second embodiment of the invention.
Figure 6:
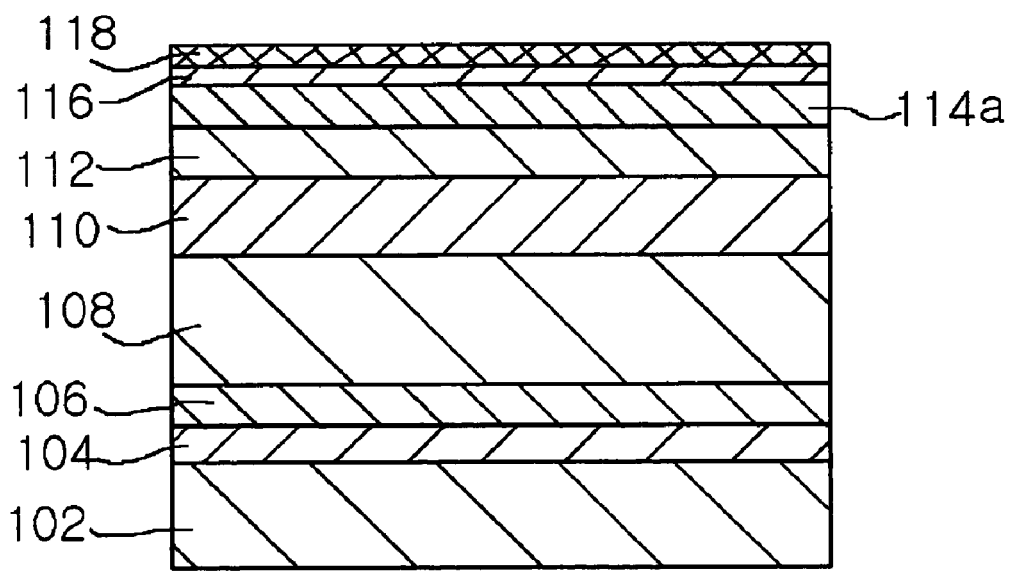
Figure 7:
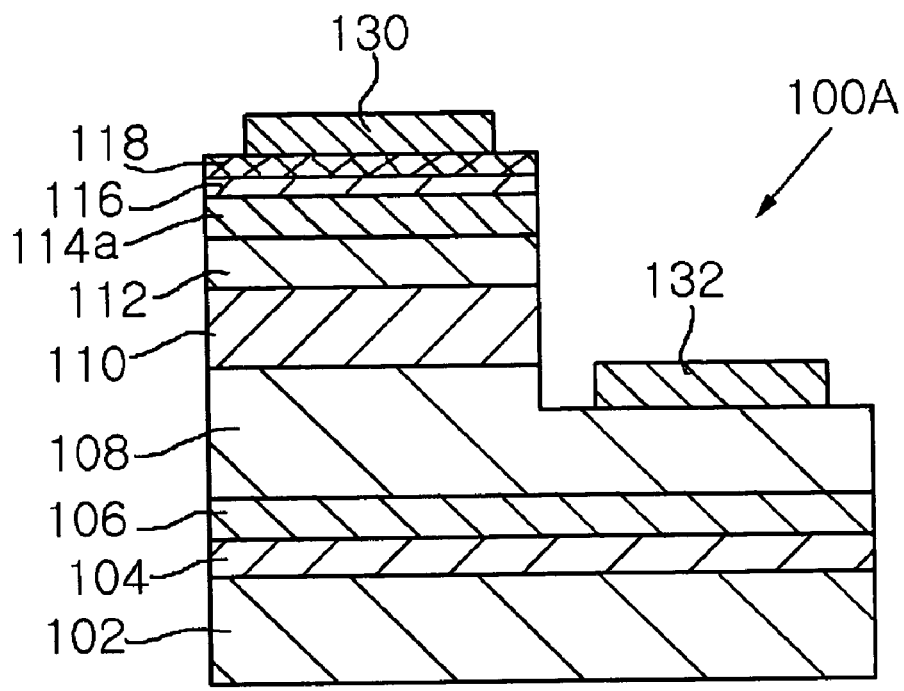

FIGS. 5 to 7 are stepwise sectional views illustrating a fabrication method of a nitride semiconductor LED according to second embodiment of the invention.

First, as shown in FIG. 5, a buffer layer 104, an undoped GaN layer 106, an n-doped semiconductor layer 108, an active layer 110, a p-doped semiconductor layer 112 and a high concentration p-doped or p+-doped semiconductor layer 114 are grown in their order on a sapphire substrate 102 to form a semiconductor structure, and anion implantation process is performed to implant low/high concentration n-dopants or n−/n+-dopants into the p+-doped semiconductor layer 114.

In this ion implantation process, an upper region of the p+-doped semiconductor layer 114 is converted into a high concentration n-doped or n+-doped semiconductor layer 116 and an upper n-doped semiconductor layer 118 but a lower region of the p+-doped semiconductor layer 114 underlying the n+-doped semiconductor layer 116 remains as a p+-doped semiconductor layer 114a in order to form a semiconductor structure as shown in FIG. 6.

The ion implantation process may be carried out by forming a SiO$_2$ buffer layer on the p+-doped semiconductor layer 114 and selectively etching the buffer layer to implant n−/n+-dopants into desired regions. In this case, the ion implantation process forms the SiO$_2$ buffer layer on the p+-doped semiconductor layer 114, i.e., the top of the semiconductor structure, etches the SiO$_2$ buffer layer to expose at least a portion of the p+-doped semiconductor layer, implants n−/n+-dopant ions through the etched portion of the SiO$_2$ buffer layer, and performs RTA to activate the n−/n+-dopants and remove the SiO$_2$ buffer layer.

The n−/n+-ion implantation process is performed at different energy levels. That is, the n+-doped semiconductor layer 116 is formed via high energy ion implantation, but the upper n-doped semiconductor layer 118 is formed via low energy ion implantation. In this case, the high energy ion implantation is performed in an energy level of 500 eV to 50 keV and preferably 1 to 10 keV. The low energy ion implantation is performed in an energy level of 100 eV to 1 keV and preferably to 300 to 500 eV.

Alternatively, the n+-doped semiconductor layer 116 may be formed in a high energy level before the n-doped semiconductor layer 118 is formed in a low energy level, in which the energy levels are the same as above.

Further, the ion implantation process may have two steps of first implanting n-dopants at a high concentration in a high energy level and then implanting n-dopants at a low concentration in a low energy level. On the contrary, this process may implant n-dopants first at a low concentration and then at a high concentration.

Subsequent heat treatment is preferably carried out in a temperature range from about 700 to 1300° C. under a nitrogen atmosphere for about 1 to 30 minutes.

Alternatively, high concentration n-dopants may be implanted into the p+-doped semiconductor layer 114 without the formation of the SiO$_2$ buffer layer. The same or different n+−/n-dopants may be used by selecting at least one from the group consisting of C, Si, Ge, Sn, Ni, P, As, Sb and so on.

Then, the semiconductor structure shown in FIG. 6 is mesa-etched to the extent of exposing a partial area of the n-doped semiconductor layer 108 as shown in FIG. 7, and p- and n-electrodes 130 and 132 are formed on the upper n-doped semiconductor layer 118 and the exposed partial area of the n-doped semiconductor layer 108, respectively, to produce a nitride semiconductor 100A of the invention.

In the nitride semiconductor 100A of this embodiment, the p+-doped semiconductor layer 114a cooperates with the overlying n+-doped semiconductor layer 116 to establish a reverse bias tunneling junction as described above thereby to obtain an excellent ohmic contact while reducing drive voltage.

Furthermore, the n+-doped semiconductor layer 116 and the upper n-doped semiconductor layer 118 cooperate to obtain lateral current spreading so that the p- and n-electrodes 130 and 132 can be bonded to the uppermost layer of the semiconductor structure without the formation of conventional transparent electrodes. As a result, this semiconductor structure can improve brightness to a specific level equivalent to light quantity absorbed by the conventional transparent electrodes.

Third Embodiment

Figure 8:
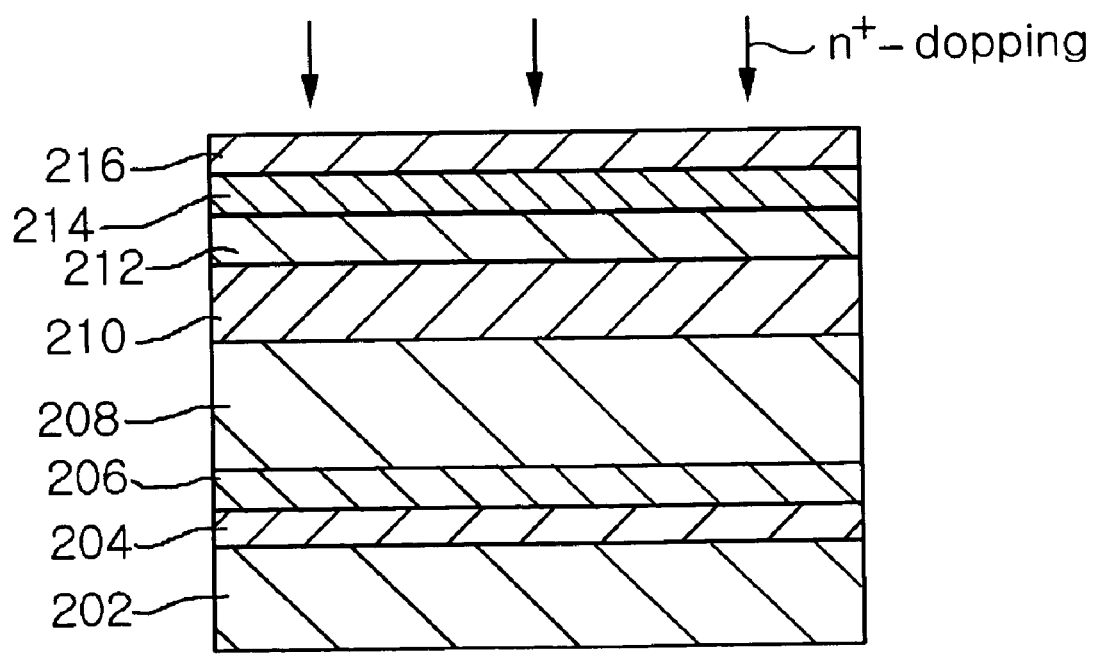
FIGS. 8 to 10 are stepwise sectional views illustrating a fabrication method of a nitride semiconductor LED according to a third embodiment of the invention.
Figure 9:
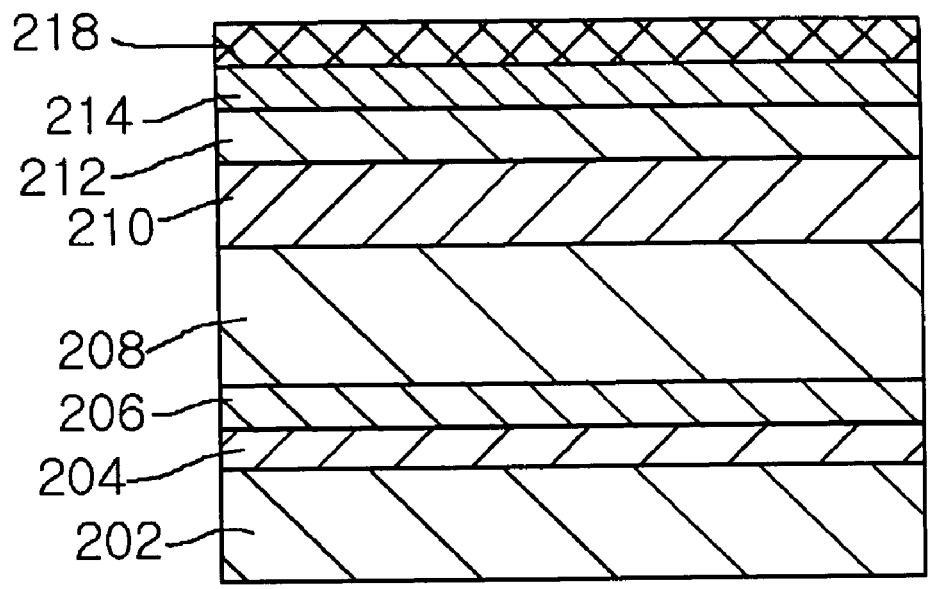
Figure 10:
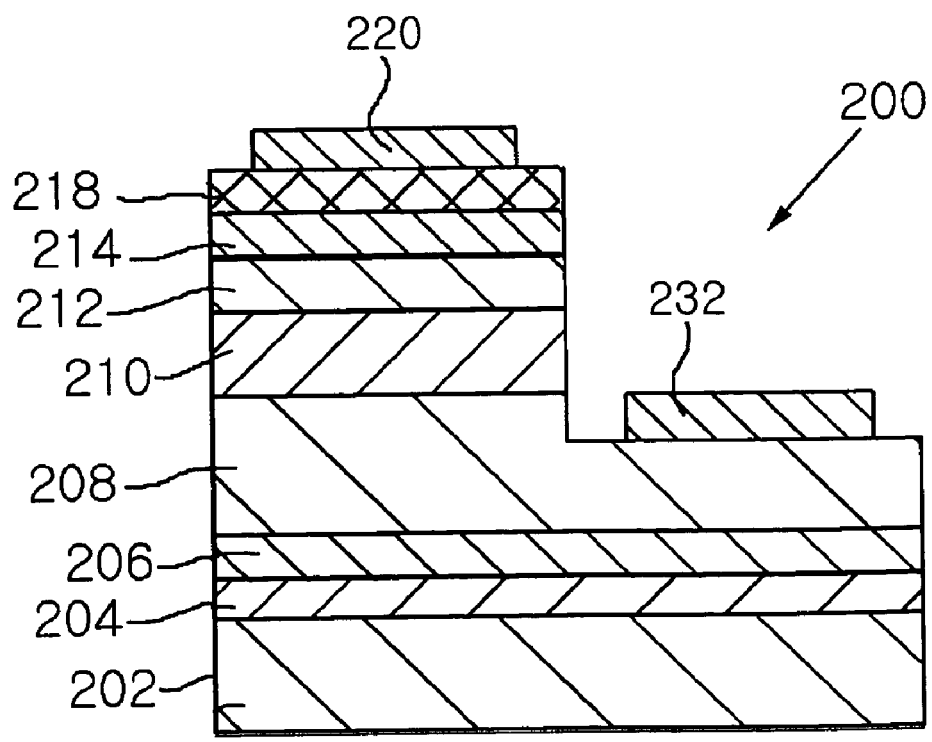

FIGS. 8 to 10 are stepwise sectional views illustrating a fabrication method of a nitride semiconductor LED according to a third embodiment of the invention.

First, as shown in FIG. 8, a buffer layer 204, an undoped GaN layer 206, an n-doped semiconductor layer 208, an active layer 210, a p-doped semiconductor layer 212, a high concentration p-doped or p+-doped semiconductor layer 214 and an upper n-doped semiconductor layer 216 are grown in their order on a sapphire substrate 202 to form a semiconductor structure. Then, n-dopants are implanted at a high concentration into the upper n-doped semiconductor layer 216 via ion implantation.

The ion implantation process converts the upper n-doped semiconductor layer 216 into a high concentration n-doped or n+-doped semiconductor layer 218 as shown in FIG. 9.

The ion implantation process first forms a $SiO_2$ buffer layer on the upper n-doped semiconductor layer 216, and selectively etches the $SiO_2$ buffer layer to implant n-dopants at a high concentration into a desired portion. In this case, the ion implantation process forms the $SiO_2$ buffer layer on the upper n-doped semiconductor layer 216, i.e., the top of the semiconductor structure, etches the $SiO_2$ buffer layer to expose a portion of the upper n-doped semiconductor layer 216, implants n-dopant ions through the etched portion of the $SiO_2$ buffer layer, and performs proper heat treatment such as Rapid RTA to activate the n-dopants and remove the $SiO_2$ buffer layer.

Preferably, the n-dopants are ion-implanted at a concentration of about 1E15 to 1E16 atoms/$cm^2$ under an acceleration voltage of about 100 eV to 50 keV. The n-dopants may be at least one selected from the group consisting of C, Si, Ge, Sn, Ni, P, As, Sb and so on. Subsequent heat treatment is preferably carried out in a temperature range from about 700 to 1300° C. under a nitrogen atmosphere for about 1 to 30 minutes.

Alternatively, n-dopants may be implanted at a high concentration into the entire upper n-doped semiconductor layer 216 without the formation of the $SiO_2$ buffer layer, in which the n-dopants may be at least one selected from the group consisting of C, Si, Ge, Sn, Ni, P, As, Sb and so on.

As the n+-doped semiconductor layer 218 is formed on the p+-doped semiconductor layer 214, a reverse bias tunneling junction is established between the semiconductor layers 218 and 214.

Then, a resultant semiconductor structure obtained as above is mesa-etched to the extent of exposing a partial area of the n-doped semiconductor layer 208, and a p-transparent electrode 220 and an n-electrode 222 are formed on the n+-doped semiconductor layer 218 and the exposed partial area of the n-doped semiconductor layer 208, respectively, to produce a nitride semiconductor 200 of the invention.

Also, because the reverse bias tunneling junction is formed between the n+-doped semiconductor layer 216 and the p+-doped semiconductor layer 214, an excellent ohmic contact is ensured between the uppermost n+-doped semiconductor layer 218 and the transparent metal electrode 220. Then, in place of a conventional Ni/Au metal layer, the p-transparent electrode 220 can be made of at least one selected from the group consisting of ITO, CTO and TiWN of excellent transparency. The transparent electrode of the invention can improve the brightness of the nitride semiconductor LED 200 since they have light transparency superior to that of the conventional transparent electrode of Ni/Au, in which for example ITO has a light transparency of about 90 to 98% but Ni/Au has a light transparency of about 65 to 80%.

This semiconductor structure as above can lower the drive voltage of the entire nitride semiconductor 200 based upon the excellent ohmic contact while improving the brightness owing to the transparent electrode 220 of excellent transparency.

Fourth Embodiment

Figure 11:
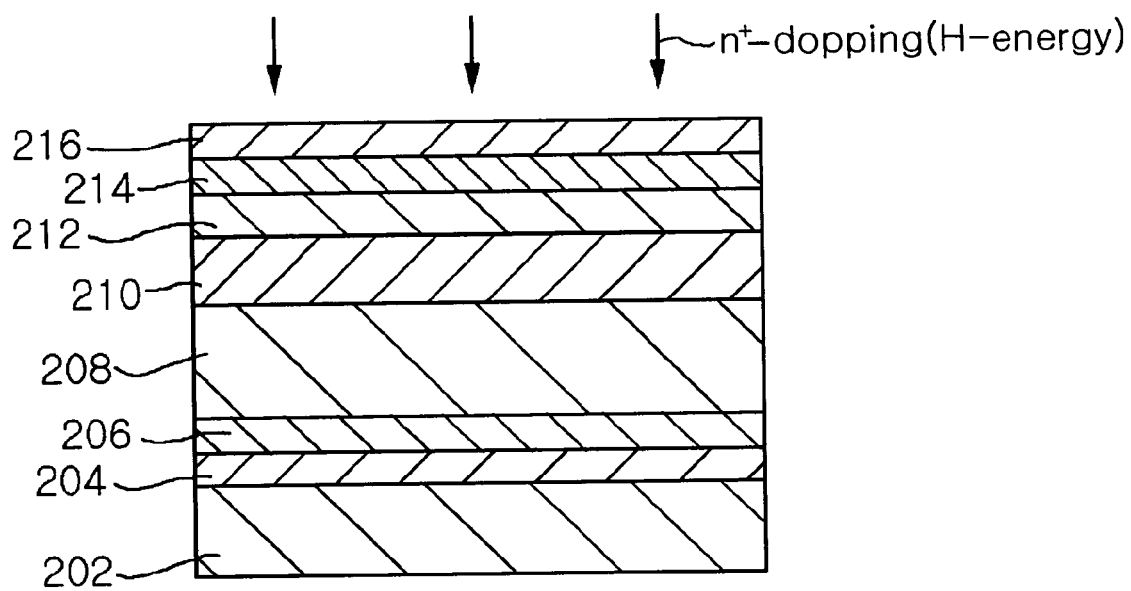
FIGS. 11 to 13 are stepwise sectional views illustrating a fabrication method of a nitride semiconductor LED according to a fourth embodiment of the invention.
Figure 12:
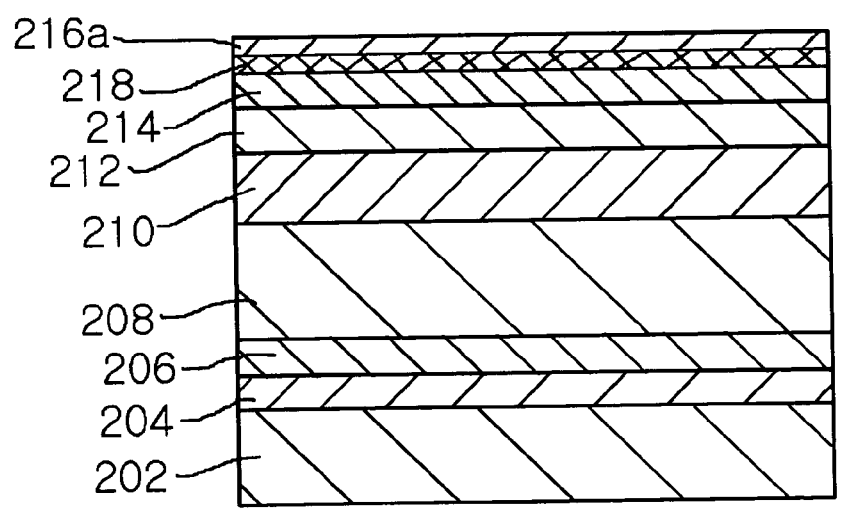
Figure 13:
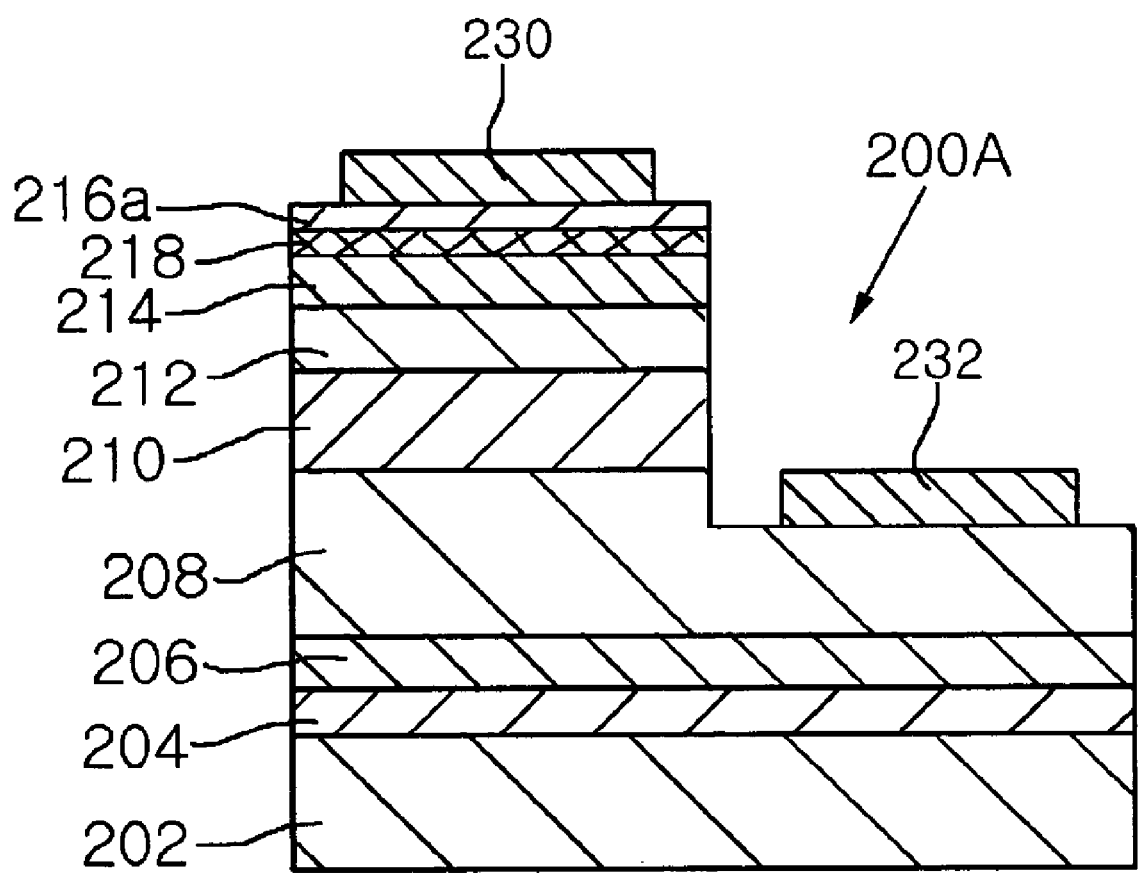

FIGS. 11 to 13 are stepwise sectional views illustrating a fabrication method of a nitride semiconductor LED according to a fourth embodiment of the invention.

First, as shown in FIG. 11, a buffer layer 204, an undoped GaN layer 206, an n-doped semiconductor layer 208, an active layer 210, a p-doped semiconductor layer 212, a high concentration p-doped or p+-doped semiconductor layer 214 and an upper n-doped semiconductor layer 216 are grown in their order on a sapphire substrate 202 to form a semiconductor structure, and n-dopants are implanted at a high concentration into the upper n-doped semiconductor layer 216 via ion implantation.

The ion implantation process first forms a $SiO_2$ buffer layer on the upper n-doped semiconductor layer 216, and selectively etches the $SiO_2$ buffer layer to implant n-dopants at a high concentration into a desired portion (i.e., 218). In this case, the ion implantation process forms the $SiO_2$ buffer layer on the upper n-doped semiconductor layer 216, i.e., the top of the semiconductor structure, etches the $SiO_2$ buffer layer to expose a portion of the upper n-doped semiconductor layer 216, implants n-dopant ions at a high concentration through the etched portion of the $SiO_2$ buffer layer, and performs proper heat treatment such as RTA to activate the n-dopants and remove the $SiO_2$ buffer layer.

The ion implantation process is carried out at a high energy level in the range of about 100 eV to 50 keV to mainly implant n-dopants at a high concentration into a lower region of the n-doped semiconductor layer 216 so that the lower region of the n-doped semiconductor layer 216 is converted into an n+-doped semiconductor layer 218 but an upper region of the n-doped semiconductor layer 216 remains as an upper n-doped semiconductor layer 216a. As a consequence, the ion implantation process forms a resultant semiconductor structure as shown in FIG. 12.

Preferably, the n-dopants are ion-implanted at a concentration of about 1E15 to 1E16 atoms/$cm^2$ under an acceleration voltage of about 100 eV to 50 keV. The n-dopants may be at least one selected from the group consisting of C, Si, Ge, Sn, Ni, P, As, Sb and so on. Subsequent heat treatment is preferably carried out in a temperature range from about 700 to 1300° C. under a nitrogen atmosphere for about 1 to 30 minutes.

Alternatively, high concentration n-dopants or n+-dopants may be implanted into the upper n-doped semiconductor layer 216 without the formation of the $SiO_2$ buffer layer.

The resultant semiconductor structure as shown in FIG. 12 is mesa-etched to the extent of exposing a partial area of the n-doped semiconductor layer 208, and p- and n-electrodes 230 and 232 are formed on the upper n-doped semiconductor layer 216a and the exposed partial area of the n-doped semiconductor layer 208, respectively, to produce a nitride semiconductor 200A of the invention as shown in FIG. 13.

In the nitride semiconductor 200A of this embodiment, the p+-doped semiconductor layer 214 cooperates with the overlying n+-doped semiconductor layer 218 to establish a reverse bias tunneling junction as described above to enable an excellent ohmic contact while reducing drive voltage.

Furthermore, the n+-doped semiconductor layer 218 and the upper n-doped semiconductor layer 216a cooperate to obtain lateral current spreading so that the p- and n-electrodes 230 and 232 can be bonded to the uppermost layer of the semiconductor structure without the formation of conventional transparent electrodes. As a result, this semiconductor structure can improve brightness to a specific level equivalent to light quantity absorbed by the conventional transparent electrodes.

Although the sapphire substrate has been adopted by the foregoing embodiments of the invention, it is merely an example. The sapphire substrate may be replaced by one selected from the group consisting of a SiC substrate, an oxide substrate and a carbide substrate.

As set forth above, the present invention can realize the excellent ohmic contact from the reverse bias tunneling junction formed between the n+-doped semiconductor layer and the underlying p+-doped semiconductor layer, thereby improving brightness while reducing drive voltage.

Further, because the n+-doped semiconductor layer cooperates with the upper n-doped semiconductor layer to realize lateral current spreading, the electrodes can be directly connected to the n-doped semiconductor layers without the formation of transparent electrode thereby improving brightness further.

While the present invention has been shown and described in connection with the preferred embodiments, it will be apparent to those skilled in the art that modifications and variations can be made without departing from the spirit and scope of the invention as defined by the appended claims.

What is claimed is:

1. A fabrication method of nitride semiconductor Light Emitting Diodes (LEDs), the method comprising the following steps of:
   (a) forming an n-doped semiconductor layer on a substrate;
   (b) forming an active layer on the n-doped semiconductor layer;
   (c) forming a p-doped semiconductor layer on the active layer;
   (d) forming a p+-doped semiconductor layer on the p-doped semiconductor layer;
   (e) implanting n-dopant ions into the p+-doped semiconductor layer to convert at least a portion of the p+-doped semiconductor layer into an n+-doped semiconductor layer so that the n+-doped semiconductor layer cooperates with a remaining region of the p+-doped semiconductor layer to form a reverse bias tunneling junction; and
   (f) mesa-etching a resultant semiconductor structure to the extent of exposing a partial area of the n-doped semiconductor layer.

2. The fabrication method of nitride semiconductor LEDs according to claim 1, wherein the ion implantation step (e) comprises:
   forming a $SiO_2$ layer on the resultant semiconductor layer;
   etching the $SiO_2$ layer to expose at least a portion of the p+-doped semiconductor layer;
   implanting n-dopant ions through the etched portion of the $SiO_2$ layer; and
   removing the $SiO_2$ layer via heat treatment.

3. The fabrication method of nitride semiconductor LEDs according to claim 1, wherein the ion implantation step (e) implants n-dopants in high and low energy levels into an upper region of the p+-doped semiconductor layer to form en n+-doped semiconductor layer on the remaining region of the p+-doped semiconductor layer and an upper n-doped semiconductor layer on the n+-doped semiconductor layer, thereby realizing lateral current spreading.

4. The fabrication method of nitride semiconductor LEDs according to claim 1, wherein the ion implantation step (e) comprises: implanting n-dopant ions at a first energy level into an upper region of the n+-doped semiconductor layer to form an n+-doped semiconductor layer on the remaining region of the p+-doped semiconductor layer; and implanting n-dopant at a second energy level different from the first energy level into the upper region of the n+-doped semiconductor layer to form an upper n-doped semiconductor layer on the n+-doped semiconductor layer, thereby realizing lateral current spreading.

5. The fabrication method of nitride semiconductor LEDs according to claim 4, further comprising the step of:
   (g) forming p- and n-electrodes on the upper n-doped semiconductor layer and the exposed partial area of the n-doped semiconductor layer, respectively, after the ion implantation step (e).

6. The fabrication method of nitride semiconductor LEDs according to claim 3, further comprising the step of:
   (g) forming p- and n-electrodes on the upper n-doped semiconductor layer end the exposed partial area of the n-doped semiconductor layer, respectively, after the ion implantation step (e).

7. The fabrication method of nitride semiconductor LEDs according to claim 1, further comprising the step of:
   (h) forming a p-transparent electrode and an n-electrode on the n+-doped semiconductor layer and the exposed partial area of the n-doped semiconductor layer, respectively, after the etching step (f),
   wherein the transparent electrode is made of at least one selected from a group consisting of Indium-Tin oxide (ITO), Cadmium-Tin Oxide (CTO) and Titanium Tungsten Nitride (TiWN).

8. A fabrication method of nitride semiconductor Light Emitting Diodes (LEDs), the method comprising the following steps of:
   (a) forming an n-doped semiconductor layer on a substrate;
   (b) forming art active layer on the n-doped semiconductor layer;
   (c) forming a p-doped semiconductor layer on the active layer;

(d) forming p+-doped semiconductor layer on the p-doped semiconductor layer;

(e) forming an upper n-doped semiconductor layer on the p+-doped semiconductor layer;

(f) implanting n-dopant ions into the upper n-doped semiconductor layer to convert at least a partial region of the upper n-doped semiconductor layer into an n+-doped semiconductor layer so that the n+-doped semiconductor layer cooperates with a remaining region of the p+-doped semiconductor layer to form a reverse bias tunneling junction; and (g) mesa-etching a resultant semiconductor structure to the extent of exposing a partial area of the n-doped semiconductor layer.

9. The fabrication method of nitride semiconductor LEDs according to claim 8, wherein the ion implantation step (f) comprises:

forming a $SiO_2$ layer on the resultant semiconductor layer;

etching the $SiO_2$ layer to expose at least a portion of the p+-doped semiconductor layer;

implanting n-dopant ions through the etched portion of the $SiO_2$ layer; and removing the $SiO_2$ layer via heat treatment.

10. The fabrication method of nitride semiconductor LEDs according to claim 8, wherein the ion implantation step (f) comprises: implanting n+-dopants at a predetermined energy level into a lower region of the n-doped semiconductor layer to form an n+-doped semiconductor layer, whereby the n+-doped semiconductor layer cooperates with en upper remaining region of the n-doped semiconductor layer to realize lateral current spreading.

11. The fabrication method of nitride semiconductor LEDs according to claim 10, further comprising the step of:

(h) forming p- and n-electrodes on the upper n-doped semiconductor layer and the exposed partial area of the n-doped semiconductor layer, respectively, after the ion implantation step (f).

12. The fabrication method of nitride semiconductor LEDs according to claim 8, further comprising the step of:

(i) forming a p-transparent and an n-electrode on the n+-doped semiconductor layer and the exposed partial area of the n-doped semiconductor layer, respectively, after the etching step (g), wherein the transparent electrode is made of at least one selected from a group consisting of Indium-Tin Oxide (ITO), Cadmium-Tin Oxide (CTO) and Titanium Tungsten Nitride (TiWN).

* * * * *